US009450021B1

(12) United States Patent
Lee

(10) Patent No.: US 9,450,021 B1
(45) Date of Patent: Sep. 20, 2016

(54) MULTI-BIT MTJ MEMORY CELL USING TWO VARIABLE RESISTANCE LAYERS

(71) Applicant: SK hynix Inc., Icheon-Si (KR)

(72) Inventor: Tae-Young Lee, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/951,048

(22) Filed: Nov. 24, 2015

(30) Foreign Application Priority Data

Jun. 1, 2015 (KR) .................. 10-2015-0077166

(51) Int. Cl.
*H01L 27/24* (2006.01)
*H01L 43/08* (2006.01)
*H01L 45/00* (2006.01)

(52) U.S. Cl.
CPC .......... *H01L 27/24* (2013.01); *H01L 27/2463* (2013.01); *H01L 43/08* (2013.01); *H01L 45/085* (2013.01); *H01L 45/1253* (2013.01); *H01L 45/145* (2013.01)

(58) Field of Classification Search
None
See application file for complete search history.

(56) References Cited

U.S. PATENT DOCUMENTS 7,925,914 B2  4/2011  Akutsu et al.
7,952,914 B2  5/2011  Baek et al.
2014/0167214 A1*  6/2014  Sills .................. H01L 23/5256
257/529
2016/0099407 A1  4/2016  Lim et al.

FOREIGN PATENT DOCUMENTS

KR  10-2016-0039798 A  4/2016

OTHER PUBLICATIONS

Chang et al., "Improvement of resistive switching characteristics in TiO 2 thin films with embedded Pt nanocrystals," Appl. Phys. Lett., 95:042104, 2009.
Jogleker et al., "The elusive memristor: properties of basic electrical circuits," Eur. J. Phys., 30:661-675, 2009.
Strukov et al., "The missing memristor found," Nature, 453:80-83, 2008.
Yoshida et al., "Unipolar resistive switching in CoFeB/MgO/CoFeB magnetic tunnel junction," Appl. Phys. Lett., 92:113508, 2008.

* cited by examiner

*Primary Examiner* — Joseph Schoenholtz
(74) *Attorney, Agent, or Firm* — Perkins Coie LLP

(57) ABSTRACT

This technology provides an electronic device. An electronic device in accordance with an implementation of this document includes a semiconductor memory, and the semiconductor memory includes a variable resistance structure including a material having a resistance that is changed by formation or dissipation of conductive filaments; and a Magnetic Tunnel Junction (MTJ) structure inserted in the variable resistance structure and comprising a first magnetic layer having a pinned magnetization direction, a second magnetic layer having a variable magnetization direction, and a tunnel dielectric layer interposed between the first magnetic layer and the second magnetic layer.

20 Claims, 10 Drawing Sheets

MULTI-BIT MTJ MEMORY CELL USING TWO VARIABLE RESISTANCE LAYERS

CROSS-REFERENCE TO RELATED APPLICATION

This patent document claims the priority and benefits of Korean Patent Application No. 10-2015-0077166, entitled "ELECTRONIC DEVICE" and filed on Jun. 1, 2015, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve operating characteristics and a degree of integration.

In one aspect, an electronic device may include a semiconductor memory, and the semiconductor memory may include a variable resistance structure including a material having a resistance that is changed by formation or dissipation of conductive filaments; and a Magnetic Tunnel Junction (MTJ) structure inserted in the variable resistance structure and comprising a first magnetic layer having a pinned magnetization direction, a second magnetic layer having a variable magnetization direction, and a tunnel dielectric layer interposed between the first magnetic layer and the second magnetic layer.

Implementations of the above electronic device may include one or more the following.

The MTJ structure has two different resistance states that correspond to a parallel magnetization direction configuration and an anti-parallel magnetization direction configuration of the first magnetic layer and the second magnetic layer, respectively. The magnetization direction of the second magnetic layer is changed by spin transfer torque. The semiconductor memory has a plurality of resistance states by a combination of a resistance state of the variable resistance layer and a resistance state of the MTJ structure. The semiconductor memory exhibits one of resistance states including: a first resistance state in which the variable resistance layer has a high resistance state and the MTJ structure has a magnetization parallel state, a second resistance state in which the variable resistance layer has a low resistance state and the MTJ structure has the magnetization parallel state, a third resistance state in which the variable resistance layer has the low resistance state and the MTJ structure has a magnetization anti-parallel state, and a fourth resistance state in which the variable resistance layer has the high resistance state and the MTJ structure has the magnetization anti-parallel state. The semiconductor memory has respective resistance values in the first to fourth resistance states such that the resistance value decreases in an order of the fourth resistance state, the first resistance state, the third resistance state and the second resistance state. The resistance state of the semiconductor memory changes in a predetermined order based on the first, second, third and fourth resistance states. A voltage with positive polarity is applied to the semiconductor memory for changing the resistance state from the first resistance state to the second resistance state and from the fourth resistance state to the first resistance state and a voltage with negative polarity is applied to the semiconductor memory for changing the resistance state from the second resistance state to the third resistance state and from the third resistance state to the fourth resistance state. A greater voltage is applied to the semiconductor memory for changing the resistance state from the first resistance state to the second resistance state and from the third resistance state to the fourth resistance state than those for changing the resistance state from the second resistance state to the third resistance state and from the fourth resistance state to the first resistance state. When an operation in which the variable resistance layer is changed from the high resistance state to the low resistance state is referred to as a first set operation, an operation in which the variable resistance layer is changed from the low resistance state to high resistance state is referred to as a first reset operation, an operation in which the MTJ structure is changed from the magnetization anti-parallel state to the magnetization parallel state is referred to as a second set operation, and an operation in which the MTJ structure is changed from the magnetization parallel state to the magnetization anti-parallel state is referred to as a second reset operation, a voltage polarity where the first and second set operations are performed is different from a voltage polarity where the first and second reset operations are performed. When an operation in which the variable resistance layer is changed from the high resistance state to the low resistance state is referred to as a first set operation, an operation in which the variable resistance layer is changed from the low resistance state to the high resistance state is referred to as a first reset operation, an operation in which the MTJ structure is changed from the magnetization anti-parallel state to the magnetization parallel state is referred to as a second set operation, and an operation in which the MTJ structure is changed from the magnetization parallel state to the magnetization anti-parallel state is referred to as a second reset operation, a magnitude of a voltage where the first set operation and the first reset operation are performed is larger than a magnitude of a voltage where the second set operation and the second reset operation are performed. The variable resistance layer includes a first variable resistance layer and a second variable resistance layer that are formed on both surfaces of the MTJ structure, respectively. The variable resistance layer includes a first variable resistance layer and a second variable resistance layer that are formed on both surfaces of the MTJ structure, respectively, the conductive filaments of the first and second variable resistance layers are maintained in the second and third resistance states, and only one of the conductive filaments of the first and second variable resistance layers is maintained in the first and fourth resistance states. The variable resistance layer comprises metal oxide. The conductive filaments include oxygen vacancies that cause the formation or the dissipation of the conductive filaments. The first and second magnetic layers have a conductivity. The variable resistance structure includes a first variable resistance layer and a second variable resistance layer that are respectively on opposite sides of the MTJ structure, and wherein the semiconductor memory comprises further includes: a first electrode coupling to the first variable resistance layer; and a second electrode coupling to the second variable resistance layer. The variable resistance layer includes a first variable resistance layer and a second variable resistance layer that are formed on both surfaces of the MTJ structure, respectively, and in an initial state, the semiconductor memory has the first resistance state and the conductive filaments of the first and second resistance layers do not exist. The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device may include an array of semiconductor memory cells, each semiconductor memory cell comprising: (1) a first variable resistance structure including a first material having a resistance that is changed by formation or dissipation of one or more conductive filaments or passages in the first material in response to a first control signal applied to the first material; (2) a Magnetic Tunnel Junction (MTJ) structure comprising a first magnetic layer having a pinned magnetization direction, a second magnetic layer having a variable magnetization direction, and a tunnel dielectric layer interposed between the first magnetic layer and the second magnetic layer, the MTJ structure being coupled to the first variable resistance structure by having the first magnetic layer in contact with the first variable resistance structure, wherein the MTJ structure exhibits a first MTJ resistance state when magnetizations of the first and second magnetic layers are parallel to each other and a second, different MTJ resistance state when magnetizations of the first and second magnetic layers are anti-parallel to each other; and (3) a second variable resistance structure including a second material having a resistance that is changed by formation or dissipation of one or more conductive filaments or passages in the second material in response to a second control signal applied to the second material, the second variable resistance structure being coupled to the MTJ structure by being in contact with the second magnetic layer; and a circuit coupled to the array of semiconductor memory cells to control the first and second variable resistance structures and the MTJ structure within each cell to obtain one of different combinations of resistance states of the MTJ structure and the first and second variable structures in each cell.

Implementations of the above electronic device may include one or more the following.

The circuit is coupled to control, within a cell, a state of the magnetization directions of the first and second magnetic layers of the MTJ structure and to apply the first and second applied control signals to the first and second variable resistance structures, respectively.

These and other aspects, implementations and associated advantages are described in greater detail in the drawings, the description and the claims.

DETAILED DESCRIPTION

Figure 1:
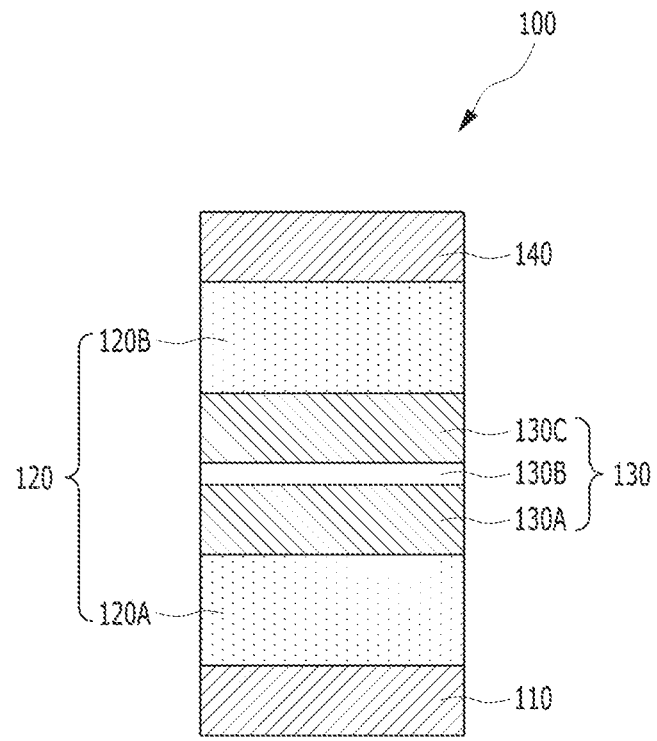
FIG. 1 is a cross-sectional view illustrating an exemplary variable resistance element in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2A:
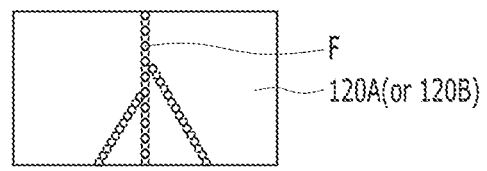
FIG. 2A is a cross-sectional view explaining characteristics of a variable resistance layer included in the variable resistance element shown in FIG. 1.
Figure 2B:
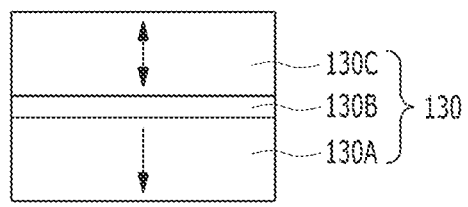
FIG. 2B is a cross-sectional view explaining characteristics of a MTJ structure included in the variable resistance element shown in FIG. 1.

FIG. 1 is a cross-sectional view explaining an exemplary variable resistance element in accordance with an implementation of the present disclosure. FIG. 2A is a cross-sectional view explaining characteristics of a variable resistance layer included in the variable resistance element shown in FIG. 1, and FIG. 2B is a cross-sectional view explaining characteristics of a MTJ structure included in the variable resistance element shown in FIG. 1.

Referring to FIG. 1, a variable resistance element 100 in accordance with an implementation may include first and second electrodes 110 and 140 spaced from each other in a first direction, a variable resistance layer, element or structure 120 interposed between the first electrode 110 and the second electrode 140, and an MTJ (Magnetic Tunnel Junction) structure 130 inserted in the variable resistance structure 120. In one implementations, the MTJ structure 130 is inserted in the middle of the variable resistance structure 120. The variable resistance structure 120 includes a portion formed above the inserted MTJ structure 130, which is referred to as the first variable resistance layer 120A, and another portion formed below the inserted the MTJ structure 130, which is referred to as the second variable resistance layer 120B. As such, the MTJ structure inserted in the variable resistance layer 120 divides the variable resistance layer 120 into first and second variable resistance layers 120A and 120B.

Here, the first electrode 110 and the second electrode 140 may serve to supply a voltage or current across the variable resistance element 100, and have a single- or multi-layered structure including various conductive materials, for example, a metal such as W, Al, or Ti and the like, metal nitride such as TiN and the like, or a combination thereof.

The variable resistance layer 120 may be formed of or include a variable resistance material having a characteristic switched between different resistance states according to an applied voltage or current. In this implementation, the variable resistance layer 120 may include the first variable resistance layer 120A disposed on one side of the MTJ structure 130 in the first direction and second variable resistance layer 120B disposed on the other side of MTJ structure 130.

Referring to FIG. 2A, each of the first and second variable resistance layers 120A and 120B may have a conductive line, path or filament F which is formed or dissipates (e.g., disappears) inside itself according to a voltage or current applied across the variable resistance layer 120. Each of the first and second variable resistance layers 120A and 120B may have a single- or a multi-layered structure including two or more layers stacked. When the conductive line, path or filament F, which allows a current flow to pass through the first and second variable resistance layers 120A and 120B, is formed in each of the first and second variable resistance layers 120A and 120B, each of the first and second variable resistance layers 120A and 120B may have, or is referred to as having, a low resistance state in the presence of the conductive line, path or filament F. Alternatively, when the conductive line, path or filament F dissipates (e.g., the conductive line, path or filament F, which previously exits, has disappeared), each of the first and second variable resistance layers 120A and 120B may have, or is referred to as having, a high resistance state in the absence of the conductive line, path or filament F. The conductive line, path or filament F may be formed in various ways according to a kind of a variable resistance material or a layer structure. For example, when the variable resistance layer 120 is formed of or includes a variable resistance material including oxygen deficient-type metal oxide containing a significant amount of oxygen vacancies, the conductive line, path or filament F may be formed or dissipate according to the behavior of oxygen vacancies. Here, the oxygen deficient-type metal oxide may be a material having oxygen less than the stoichiometric ratio such as $TiO_x$ (wherein, x<2), $TaO_y$ (wherein, y<2.5), or $HfO_z$ (wherein, z<2) and the like.

However, the implementation is not limited thereto and the variable resistance layer 120 may be formed of various variable resistance materials by which the conductive filament may be formed or dissipate, for example, perovskite-based metal oxide, or transition metal oxide and the like.

The first and second variable resistance layers 120A and 120B may be formed of or include the same material, for example, the same metal oxide. The MTJ structure 130 may include a first magnetic layer 130A which is electrically conductive, a second magnetic layer 130C which is electrically conductive, and a tunnel dielectric layer 130B interposed between the first magnetic layer 130A and the second magnetic layer 130C. The first electrode 110 and the first magnetic layer 130A of the MTJ structure 130 are respectively disposed at two opposite ends of the first variable resistance layer 120A of the variable resistance structure 120 to function as two electrodes applying a voltage or current to the first variable resistance layer 120A. Similarly, the second electrode 140 and the second magnetic layer 130C are disposed at two opposite ends of the second variable resistance layer 120B of the variable resistance structure 120 to function as two electrodes applying a voltage or current to the second variable resistance layer 120B. Since the first and second magnetic layers 130A and 130C are electrically conductive, the first and second magnetic layers 130A and 130C can function as the electrodes.

The MTJ structure 130 is a variable resistance structure because it may be switched between different resistance states according to the relative magnetization directions of the first and second magnetic layers 130A and 130C with respect to each other due to, for example, the spin transfer torque operation within the MTJ structure 130.

More specifically, referring to FIG. 2B, one of the first magnetic layer 130A and the second magnetic layer 130C may be used as a pinned layer having a pinned magnetization direction, and the other may be used as a free layer having a variable magnetization direction. The magnetization direction of the free layer may be changed by spin transfer torque. In this implementation, it is shown that the first magnetic layer 130A is the pinned layer and the second magnetic layer 130C is the free layer, however the opposite case is also possible. Here, the first and second magnetic layers 130A and 130C may have a magnetization direction perpendicular to surfaces of the layers in an example of an out-of-plane or perpendicular magnetic anisotropy in FIG. 2B. For example, as shown by arrows for the magnetization directions of the magnetic layers 130A and 130C of the MTJ structure 130, the magnetization direction of the second magnetic layer 130C may be changed between a downward direction and an upward direction, and the magnetization direction of the first magnetic layer 130A may be fixed to a downward direction. The two resistance states of the MTJ structure 130 are different resistance values associated with the anti-parallel (AP) configuration where the magnetization directions of the magnetic layers 130A and 130C are opposite to each other and the parallel (P) configuration where the magnetization directions of the magnetic layers 130A and 130C are parallel to each other. The first and second magnetic layers 130A and 130C may have a single- or multi-layered structure including a ferromagnetic material. For example, the first and second magnetic layers 130A and 130C may include an alloy such as an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B allot, etc. or a stack structure of Co/Pt, or Co/Pd, etc.

The tunnel dielectric layer 130B may change the magnetization direction of the free layer through tunneling of electrons. The tunnel dielectric layer 130B may have a single- or multi-layered structure including an insulating material, for example, MgO, $Al_2O_3$, AN, RuO, SrO, $TiO_2$, $Si_3N_4$, CaO, $HfO_2$, $Ta_2O_5$, $ZrO_2$, SiC, $SiO_2$, SiON, VO, or NbO and the like.

Such MTJ structure 130 may have a low resistance state when the magnetization directions of the first magnetic layer 130A and the second magnetic layer 130C are parallel to each other. On the other hand, the MTJ structure 130 may have a high resistance state when the magnetization directions of the first magnetic layer 130A and the second magnetic layer 130C are anti-parallel to each other.

Therefore, the variable resistance element 100 described above have different variable resistance mechanisms that are different in nature and operate in combination. The variable resistance structure 120 exhibits a resistance which can be changed by formation or dissipation/disappearance of the conductive line, path or filament F while the MTJ structure 130 exhibits a resistance which can be changed by a change in the relative magnetization direction of the pinned and free layers by spin transfer torque. The variable resistance structure 120 and the MTJ structure 130 may be switched between different resistance states relative to each other and may have different operating voltages. For example, the operating voltage of the variable resistance structure 120 may be higher than that of the MTJ structure 130. Hence, the variable resistance element 100 can be operated in a way to take the advantage of having various resistance states by a combination of a variable resistance state of the variable resistance structure 120 with a variable resistance state of the MTJ structure 130. In some implementations, the variable resistance element 100 may be operated by controlling the above two different variable resistance mechanisms to function as a multi level cell (MLC) capable of storing a plurality of data. As a result, a degree of integration of a semiconductor memory including the variable resistance element 100 can be improved. Specific operations of the variable resistance element 100 are described below referring to FIGS. 3A to 5.

For proper MLC operations, the different resistance states of the above variable resistance element 100 should be clearly classified. A distribution of the resistance states is very important because if there is interference in the resistance states, a failure may occur in a read operation. In this aspect, when the MTJ structure 130 capable of functioning as an electrode is inserted in the middle of the variable resistance structure 120 as this implementation, a resistance distribution may be improved. If the electrode is inserted in the middle of the variable resistance material, the electric field concentration may be improved and thus the conductive line, path or filament may be formed more easily in the variable resistance material.

In summary, in this implementation, it is possible to implement a multi level cell and improve a resistance distribution by inserting the MTJ structure as the conductive material in a variable resistance material.

Figure 3A:
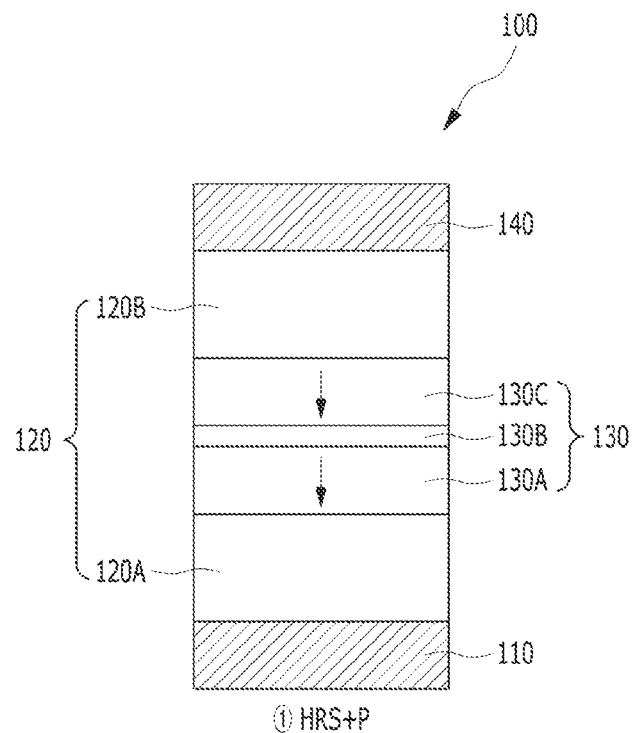
FIGS. 3A through 3E are cross-sectional views explaining a resistance state of the variable resistance element shown in FIG. 1.
Figure 3B:
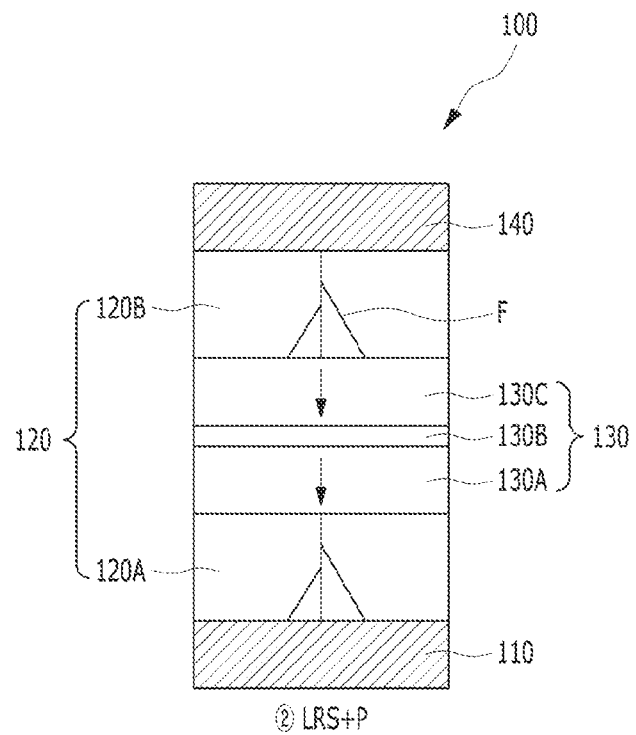
Figure 3C:
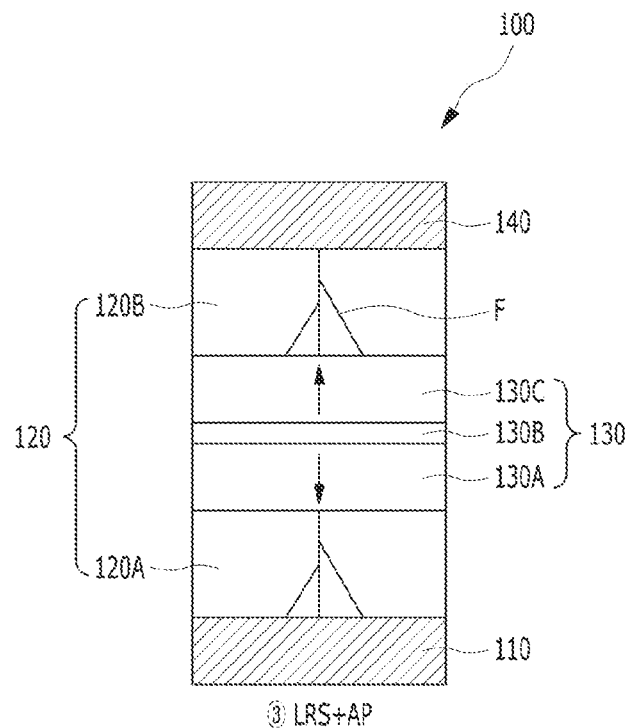
Figure 3D:
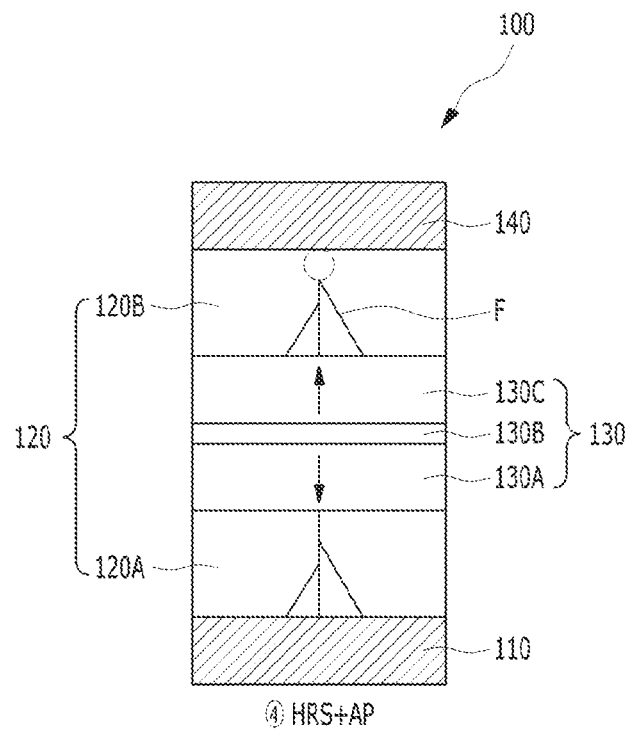
Figure 3E:
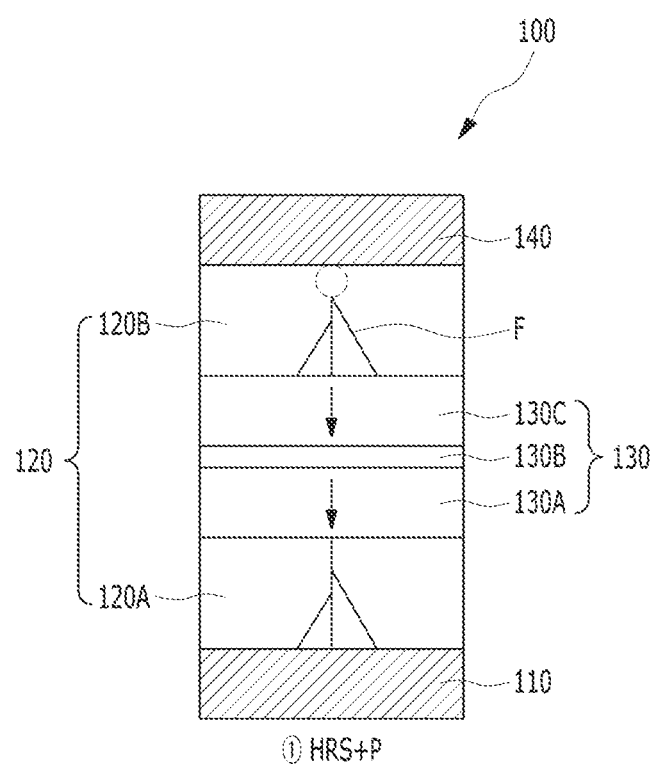
Figure 4:
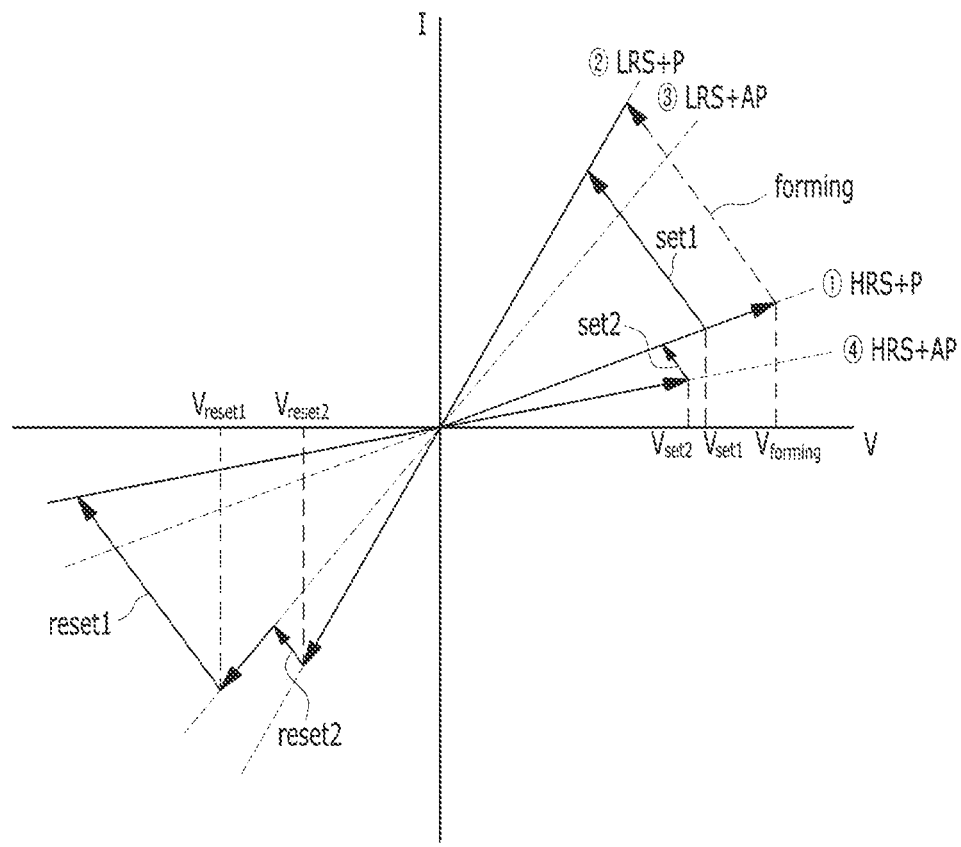
FIG. 4 is a current-voltage diagram explaining a resistance switching operation of the variable resistance element shown in FIG. 1.
Figure 5:
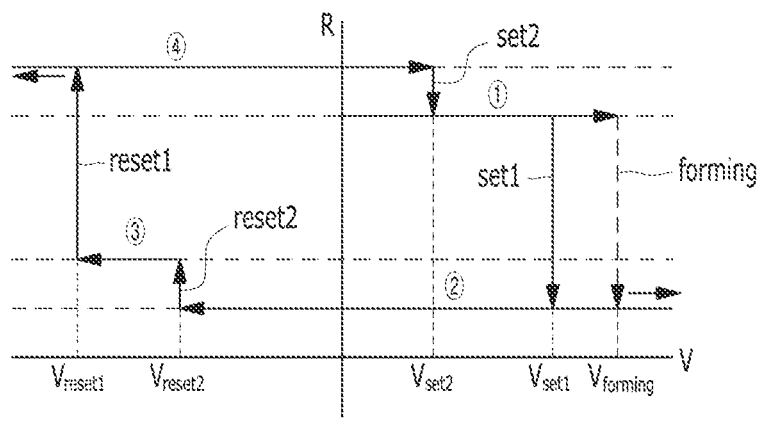
FIG. 5 is a resistance-voltage diagram explaining a resistance switching operation of the variable resistance element shown in FIG. 1.

FIGS. 3A to 3E are cross-sectional views explaining a resistance state of the variable resistance element shown in FIG. 1, FIG. 4 is a current-voltage diagram explaining a resistance switching operation of the variable resistance element shown in FIG. 1, and FIG. 5 is a resistance-voltage diagram explaining a resistance switching operation of the variable resistance element shown in FIG. 1.

FIGS. 3A, 4 and 5 show an initial state of the variable resistance element. In the initial state, since the conductive filaments do not exist in the first and second variable resistance layers 120A and 120B, a resistance of the variable resistance layer 120 may be high. Moreover, in an initial state, since the magnetization directions of the first and second magnetic layers 130A and 130C are parallel to each other, a resistance of the MTJ structure 130 may be low. In order to separate a resistance state of the variable resistance layer 120 and a resistance state of the MTJ structure 130 from each other, it is expressed that the variable resistance layer 120 has a high resistance state HRS or a low resistance state LRS, and the MTJ structure 130 has a magnetized parallel state P having a low resistance or a magnetized anti-parallel state AP having a high resistance. In such initial state, the variable resistance layer 120 may have the high resistance state HRS and the MTJ structure 130 may have the low resistance state, that is, the magnetized parallel state P. As a result, the variable resistance element 100 may have a first resistance state ① where the variable resistance layer 120 has the high resistance state HRS and the MTJ structure 130 has the magnetized parallel state P.

Referring to FIGS. 3B, 4 and 5, if a voltage applied to the variable resistance element 100 in the first resistance state ① reaches a value having a first polarity, for example, a predetermined positive voltage, conductive filaments F may be formed in the first and second variable resistance layers 120A and 120B. For example, when the first and second variable resistance layers 120A and 120B are formed of or include metal oxide containing oxygen vacancies, if a positive voltage is applied to the second electrode 140 as compared with the first electrode 110, the oxygen vacancies moves in a direction from the second electrode 140 toward the first electrode 110 and thus the conductive filaments F may be formed by the oxygen vacancies in each of the first and second variable resistance layers 120A and 120B. As such, a first set operation set1 in which a resistance state of the variable resistance layer 120 is changed from the high resistance state (HRS) to the low resistance state (LRS) may be performed. Hereinafter, a voltage for the first set operation set1 may be referred to as a first set voltage Vset1.

On the other hand, since the first and second magnetic layers 130A and 130C of the MTJ structure 130 have the magnetization directions parallel to each other in a voltage region having the first polarity, for example, a positive voltage region, the MTJ structure 130 may maintain the magnetized parallel state. As described below, the MTJ structure 130 may have an anti-parallel (AP) magnetization direction in a voltage region having a second polarity different from the first polarity, for example, a negative voltage region.

As a result, the variable resistance element 100 may have a second resistance state ② where the variable resistance layer 120 has the low resistance state LRS and the MTJ structure 130 has the magnetized parallel state P. In the second resistance state ②, the variable resistance element 100 has a resistance lower than that in the first resistance state ①.

While a first set operation set1 may be repeated plural times, the first set operation set1 which is initially performed among the plurality of the first set operations set1 may be referred to as a forming operation. A forming voltage V in the forming operation may be higher than the first set voltage Vset1. The reason is that higher voltage is required to initially form the conductive filament F in the variable resistance layer 120 than those in the first set operations set1.

Referring to FIGS. 3C, 4 and 5, the second resistance state ② of the variable resistance element 100 may be maintained even though the voltage is changed until the voltage reaches a value having the second polarity, for example a predetermined negative voltage. When the voltage has the value of the second polarity, a magnetization direction of the second magnetic layer 130C functioning as the free layer of the MTJ structure 130 may be varied and become anti-parallel to the first magnetic layer 130A. That is, the magnetization status of the MTJ structure 130 is changed from the magnetized parallel state P having a low resistance to the magnetized anti-parallel state AP having a high resistance. This operation causing the change of the magnetization state of the MTJ structure 130 from the parallel state P to anti-parallel state AP will be referred to as a second reset operation reset2. Further, a voltage in the second reset operation reset2 may be referred to as a second reset voltage Vreset2.

Meanwhile, since operating voltages of the variable resistance layer 120, i.e., the first set voltage Vset1 and a first reset voltage Vreset1 described below, are higher than operating voltages of the MTJ structure 130, i.e., the second reset voltage Vreset2 and a second set voltage Vset2 described below, the variable resistance layer 120 may maintain the low resistance state LRS at the second reset voltage Vreset2.

As a result, the variable resistance element 100 may have a third resistance state ③ where the variable resistance layer 120 has the low resistance state LRS and the MTJ structure 130 has the magnetized anti-parallel state AP. In the third resistance state ③, a resistance of the variable resistance element 100 may be lower than that in the first resistance state ① and higher than that in the second resistance state ②.

Referring to FIGS. 3D, 4 and 5, the third resistance state ③ of the variable resistance element 100 may be maintained even though a voltage is changed until an applied voltage reaches a value having the second polarity (e.g., a negative voltage) and higher than the second reset voltage Vreset2. The voltage value of the third resistance state ③ may allow one of the conductive filaments F formed in the first and second variable resistance layers 120A and 120B to be cut off and dissipate (see, a dotted line). Here, the other one of the conductive filaments F formed in the first and second variable resistance layers 120A and 120B may be maintained without the cut off and the dissipation. If all the conductive filaments F formed in the first and second variable resistance layers 120A and 120B are cut off, it may be relatively difficult to allow a current to flow in the MTJ structure 130 in a second set operation set2 shown in FIG. 3E, which makes a resistance switching of the MTJ structure 130 difficult to occur. In this implementation, the conductive filament F of the second variable resistance layer 120B is cut off. In another implementation, the conductive filament F of the first variable resistance layer 120A instead of the second variable resistance layer 120B may be cut off. It is possible to cut any one between conductive filaments F formed in the first and second variable resistance layers 120A and 120B off by using various methods. For example, when the conductive filament F of the second variable resistance layer 120B is cut off, since the first variable resistance layer 120A is not provided with a sufficient voltage or current to cut off the conductive filament F of the first variable resistance layer 120A, the conductive filament F of the first variable resistance layer 120A may be maintained. Alternatively, any one between conductive filaments F in the first and second variable resistance layers 120A and 120B may be cut off by configuring the first variable resistance layer 120A to be different from the second variable resistance layer 120B in materials, layer structures, or thickness, and so on.

When the conductive filaments F are formed by oxygen vacancies in the first and second variable resistance layers 120A and 120B, if a negative voltage is applied to the second electrode 140 as compared with the first electrode 110, the oxygen vacancies may move in a direction toward the second electrode 140 and the conductive filament F may be cut off. In this implementation, the conductive filament F in the second variable resistance layer 120B adjacent to the second electrode 140 may be cut off and the conductive filament F in the first variable resistance layer 120A may be maintained. Also in this case, since a current flow through the variable resistance layer 120 is blocked, the variable resistance layer 120 may have the high resistance state HRS.

The operation causing the change of the resistance state of the variable resistance layer 120 from the low resistance state LRS to the high resistance state HRS may be referred to as a first reset operation reset1. Moreover, a voltage in the first reset operation reset1 may be referred to as the first reset voltage Vreset1.

Meanwhile, since the first and second magnetic layers 130A and 130C of the MTJ structure 130 have the magnetization directions anti-parallel to each other in a voltage range having the second polarity, for example, a negative voltage range, the MTJ structure 130 may maintain the magnetized anti-parallel state AP.

As a result, the variable resistance element 100 may have a fourth resistance state ④ where the variable resistance layer 120 has the high resistance state HRS and the MTJ structure 130 has the magnetized anti-parallel state AP. In the fourth resistance state ④, a resistance of the variable resistance element 100 may be higher than those in the first resistance state ①, the second resistance state ② and the third resistance state ③.

Referring to FIGS. 3E, 4 and 5, the fourth resistance state ④ may be maintained even though a voltage is changed until the voltage reaches a value having the first polarity and lower than the first set voltage Vset1, e.g., a predetermined positive voltage. In this case, the magnetization direction of the second magnetic layer 130C functioning as the free layer of the MTJ structure 130 may be varied and become a state parallel to the first magnetic layer 130A. The magnetization status of the MTJ structure 130 is changed from the magnetized anti-parallel state AP having a high resistance to the magnetized parallel state P having a low resistance. This operation causing the change of the magnetization state of the MTJ structure 130 from the magnetized anti-parallel state AP to the magnetized parallel state P having a low resistance will be referred to as a second set operation Vset2. Further, a voltage in the second set operation set2 may be referred to as the second set voltage Vset2.

Meanwhile, since an operating voltage of the variable resistance layer 120 is higher than that of the MTJ structure 130, the variable resistance layer 120 may maintain the high resistance state HRS in the second set voltage Vset2.

As a result, the variable resistance element 100 may have the first resistance state again where the variable resistance layer 120 has the high resistance state HRS and the MTJ structure 130 has the magnetized parallel state P.

In such a manner, the variable resistance element 100 may be repeatedly switched among the second resistance state ② of FIG. 3B, the third resistance state ③ of FIG. 3C, the fourth resistance state ④ of FIG. 3D and the first resistance state ① of FIG. 3E except for the initial state of FIG. 3A. Thus, the variable resistance element 100 may function as a memory cell capable of storing four data.

If a resistance switching occurs by spin transfer torque in the MTJ structure 130, both the variable resistance layer 120 and the MTJ structure 130 may be switched by a current. Thus, it is possible to realize a memory cell with a simplicity and a high degree of integration.

A plurality of variable resistance elements 100 described above may be arranged in various ways to form a memory cell array. For example, a memory cell array having a cross-point structure shown in FIG. 6 may be implemented.

Figure 6:
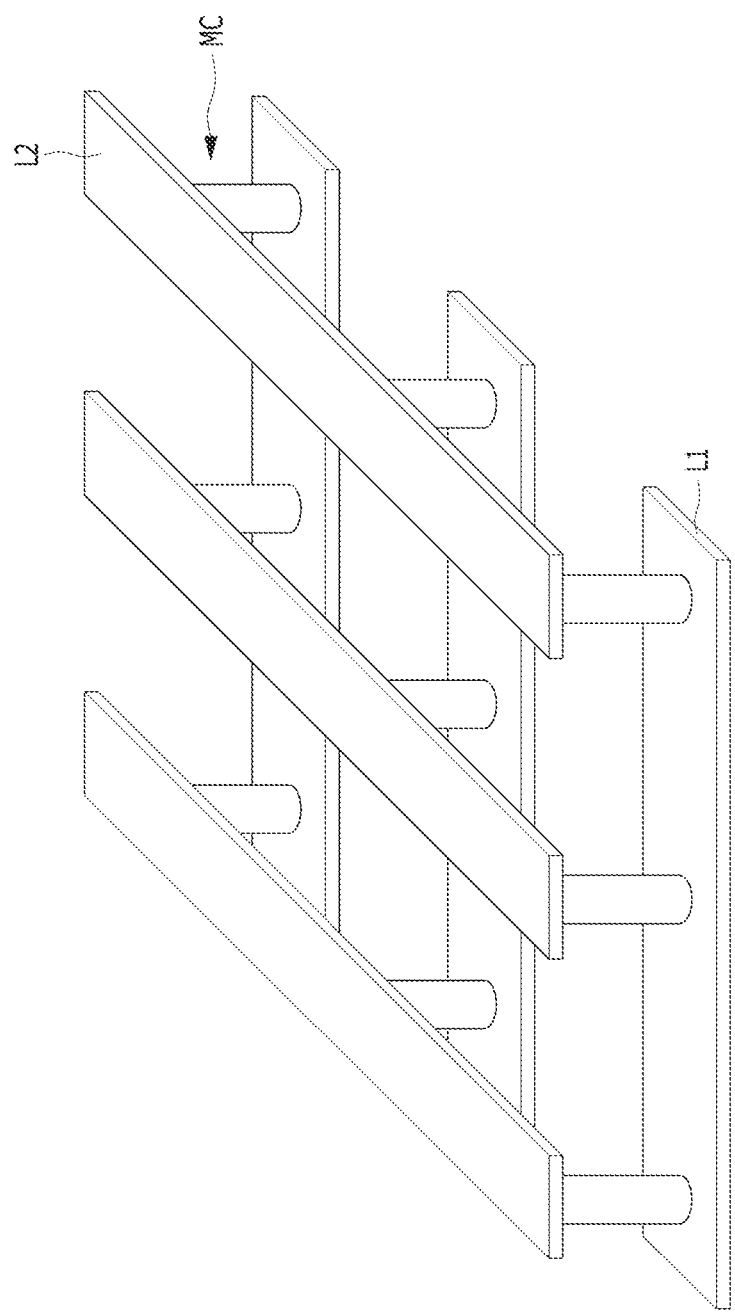
FIG. 6 is a perspective view explaining an exemplary memory cell array in accordance with an implementation of the present disclosure.

FIG. 6 is a perspective view explaining an exemplary memory cell array in accordance with an implementation of the present disclosure.

Referring to FIG. 6, the memory cell array in accordance with the implementation may have a cross-point structure and include a plurality of first lines L1 extending in one direction, a plurality of second lines L2 formed over the first lines L1 and extending in a direction crossing the first lines L1, and a plurality of memory cells MC arranged between the first lines L1 and the second lines L2. Each of the plurality of memory cells MC connects one of the first lines L1 and one of the second lines L2.

In some implementations, each of the plurality of memory cells MC may be substantially the same as the variable resistance element 100 described above. Alternatively, each of the plurality of memory cells MC may have a structure in which the first electrode 110 and/or the second electrode 140 is omitted from the variable resistance element 100. In this case, the first lines L1 may function as the first electrode 100 or the second lines L2 may function as the second electrode 140.

The various features in FIGS. 1, 4, 5 and 6 can be used to construct an electronic device that includes a semiconductor memory exhibiting multiple states for memory operations. Such a semiconductor memory can include a first variable resistance structure including a first material having a resistance that is changed by formation or dissipation of one or more conductive filaments or passages in the first material in response to a first control signal applied to the first material (FIG. 1 and FIGS. 4-5) and a MTJ structure comprising a first magnetic layer having a pinned magnetization direction, a second magnetic layer having a variable magnetization direction, and a tunnel dielectric layer interposed between the first magnetic layer and the second magnetic layer (FIG. 1). The MTJ structure is coupled to the first variable resistance structure by having the first magnetic layer in contact with the first variable resistance structure as shown by, e.g., layers 120A and 130A in FIG. 1. The MTJ structure exhibits a first MTJ resistance state when magnetizations of the first and second magnetic layers are parallel to each other and a second, different MTJ resistance state when magnetizations of the first and second magnetic layers are anti-parallel to each other. This semiconductor memory also includes a second variable resistance structure including a second material having a resistance that is changed by formation or dissipation of one or more conductive filaments or passages in the second material in response to a second control signal applied to the second material (FIG. 1 and FIGS. 4-5). The second variable resistance structure is coupled to the MTJ structure by being in contact with the second magnetic layer as shown by, e.g., layers 120B and 130C in FIG. 1. Notably, FIG. 6 shows an example of an memory array with multiple identically constructed semiconductor memory cells and associated circuitry connections in an arrangement of rows and columns. In addition, as shown by the examples in FIGS. 4, 5 and 6, a circuit is provided to couple to the first and second variable resistance structures and the MTJ structure of each memory cell to control a state of the magnetization directions of the first and second magnetic layers of the MTJ structure and to apply the first and second applied control signals to the first and second variable resistance structures, respectively, to obtain one of different combinations of resistance states of the MTJ structure and the first and second variable structures. FIGS. 3B, 3C, 3D, 3E and FIGS. 4-5 show some examples of such different combinations of resistance states for the memory operations of each cell.

The above and other memory circuits or semiconductor devices based on the disclosed technology can be used in a range of devices or systems. FIGS. 7-11 provide some examples of devices or systems that can implement the memory circuits disclosed herein.

Figure 7:
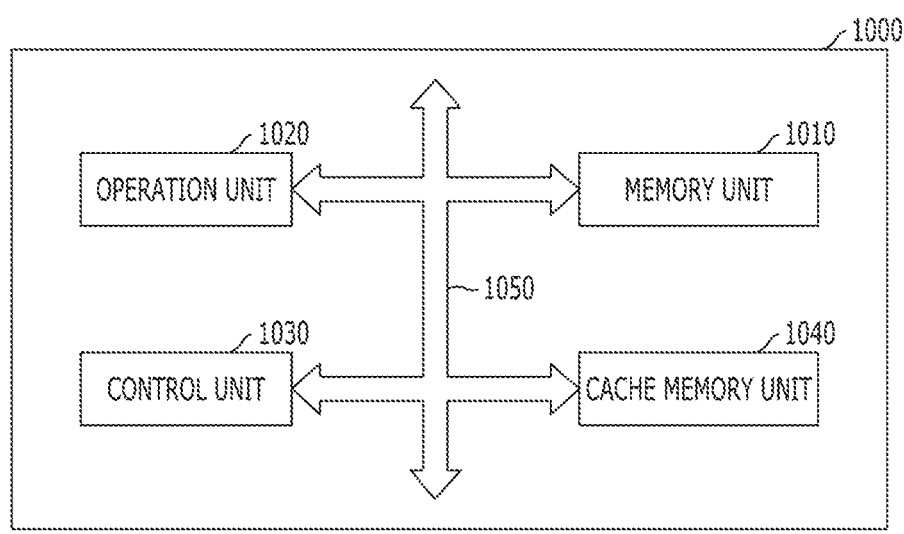
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance structure including a material having a resistance that is changed by formation or dissipation of conductive filaments; and a Magnetic Tunnel Junction (MTJ) structure inserted in the variable resistance structure and comprising a first magnetic layer having a pinned magnetization direction, a second magnetic layer having a variable magnetization direction, and a tunnel dielectric layer interposed between the first magnetic layer and the second magnetic layer. Through this, operating characteristics and degree of integration of the memory unit 1010 may be improved. As a consequence, operating characteristics and degree of integration of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
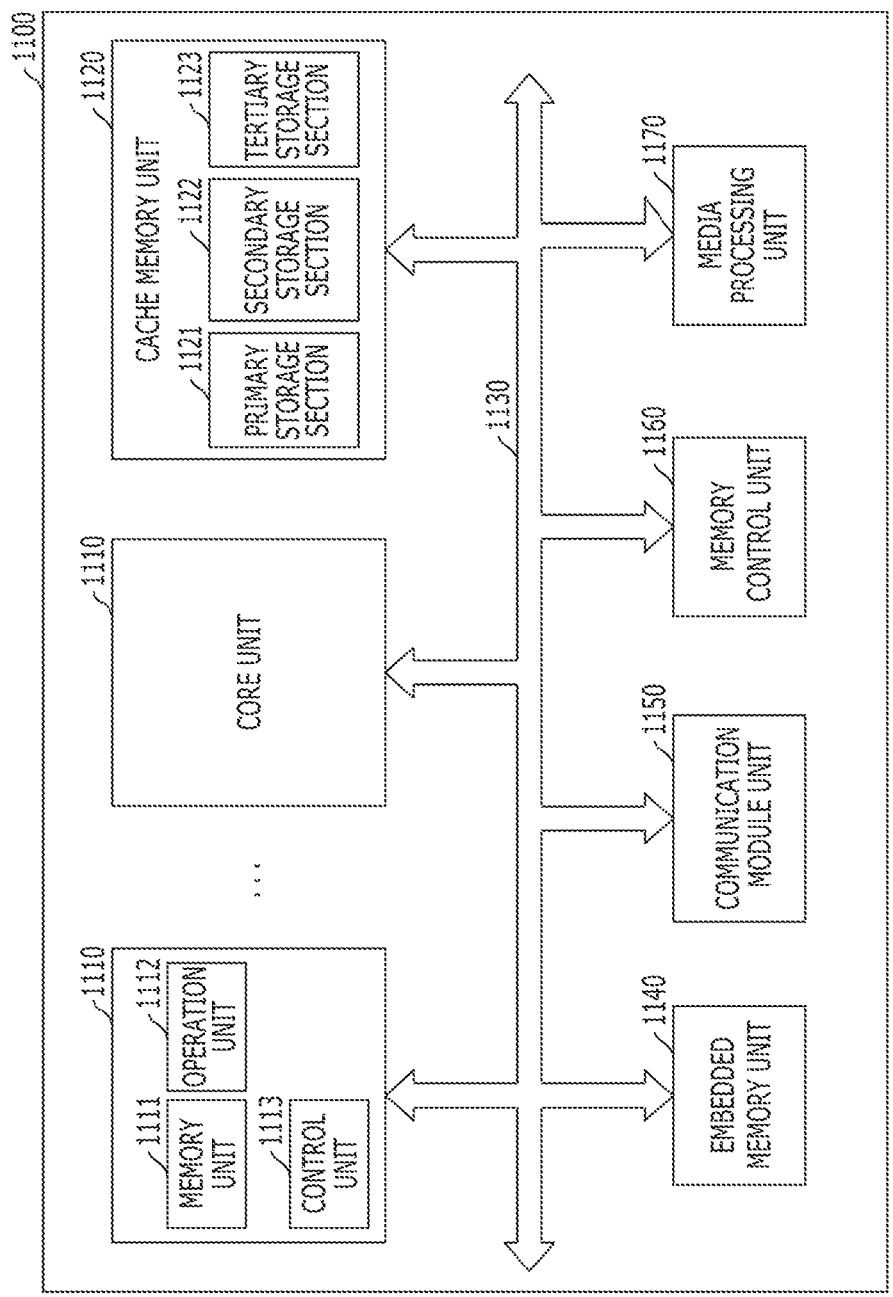
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance structure including a material having a resistance that is changed by formation or dissipation of conductive filaments; and a Magnetic Tunnel Junction (MTJ) structure inserted in the variable resistance structure and comprising a first magnetic layer having a pinned magnetization direction, a second magnetic layer having a variable magnetization direction, and a tunnel dielectric layer interposed between the first magnetic layer and the second magnetic layer. Through this, operating characteristics and degree of integration of the cache memory unit 1120 may be improved. As a consequence, operating characteristics and degree of integration of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
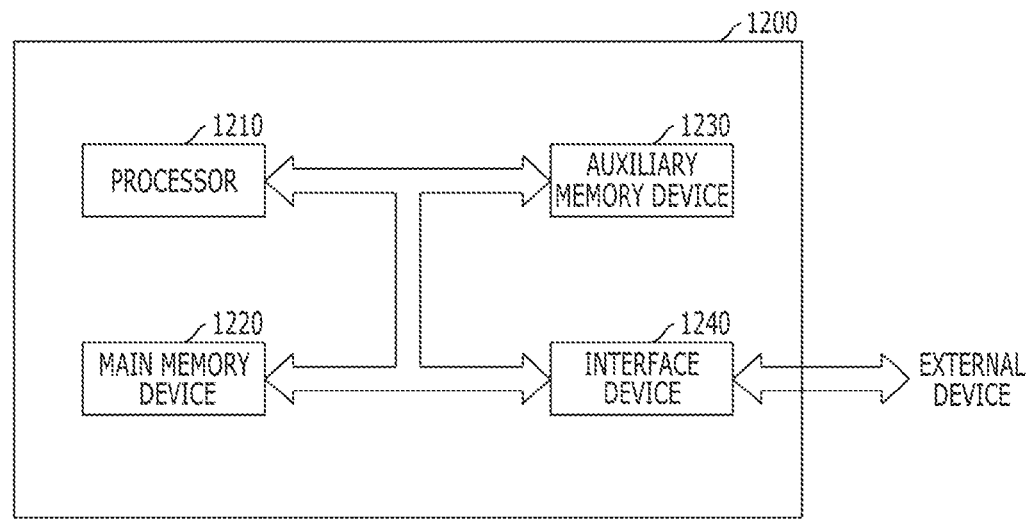
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance structure including a material having a resistance that is changed by formation or dissipation of conductive filaments; and a Magnetic Tunnel Junction (MTJ) structure inserted in the variable resistance structure and comprising a first magnetic layer having a pinned magnetization direction, a second magnetic layer having a variable magnetization direction, and a tunnel dielectric layer interposed between the first magnetic layer and the second magnetic layer. Through this, operating characteristics and degree of integration of the main memory device 1220 may be improved. As a consequence, operating characteristics and degree of integration of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance structure including a material having a resistance that is changed by formation or dissipation of conductive filaments; and a Magnetic Tunnel Junction (MTJ) structure inserted in the variable resistance structure and comprising a first magnetic layer having a pinned magnetization direction, a second magnetic layer having a variable magnetization direction, and a tunnel dielectric layer interposed between the first magnetic layer and the second magnetic layer. Through this, operating characteristics and degree of integration of the auxiliary memory device 1230 may be improved. As a consequence, operating characteristics and degree of integration of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
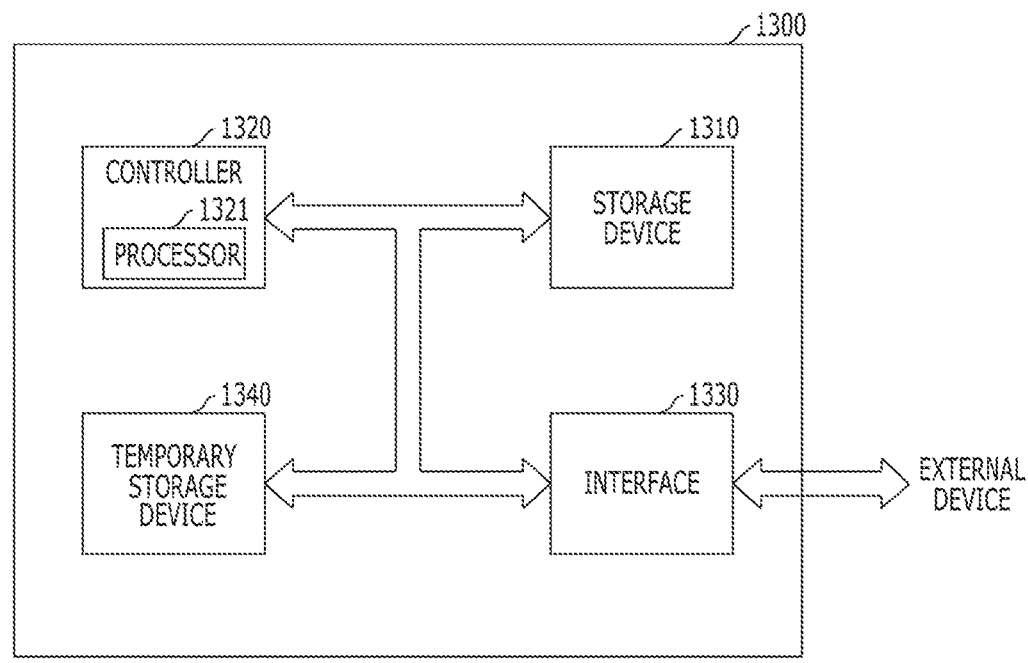
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance structure including a material having a resistance that is changed by formation or dissipation of conductive filaments; and a Magnetic Tunnel Junction (MTJ) structure inserted in the variable resistance structure and comprising a first magnetic layer having a pinned magnetization direction, a second magnetic layer having a variable magnetization direction, and a tunnel dielectric layer interposed between the first magnetic layer and the second magnetic layer. Through this, operating characteristics and degree of integration of the storage device 1310 or the temporary storage device 1340 may be improved. As a consequence, operating characteristics and degree of integration of the data storage system 1300 may be improved.

Figure 11:
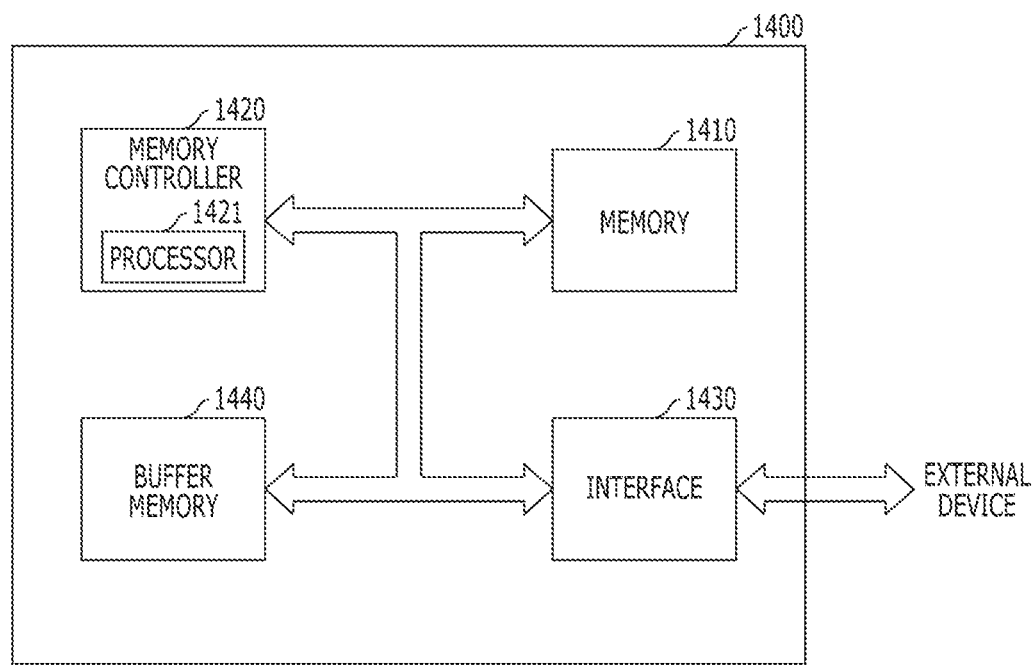
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance structure including a material having a resistance that is changed by formation or dissipation of conductive filaments; and a Magnetic Tunnel Junction (MTJ) structure inserted in the variable resistance structure and comprising a first magnetic layer having a pinned magnetization direction, a second magnetic layer having a variable magnetization direction, and a tunnel dielectric layer interposed between the first magnetic layer and the second magnetic layer. Through this, operating characteristics and degree of integration of the memory 1410 may be improved. As a consequence, operating characteristics and degree of integration of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance structure including a material having a resistance that is changed by formation or dissipation of conductive filaments; and a Magnetic Tunnel Junction (MTJ) structure inserted in the variable resistance structure and comprising a first magnetic layer having a pinned magnetization direction, a second magnetic layer having a variable magnetization direction, and a tunnel dielectric layer interposed between the first magnetic layer and the second magnetic layer. Through this, operating characteristics and degree of integration of the buffer memory 1440 may be improved. As a consequence, operating characteristics and degree of integration of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

According to the above implementation, an electronic device having improved operation characteristics and a high degree of integration may be provided.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
    a variable resistance structure including a material having a resistance that is changed by formation or dissipation of conductive filaments; and
    a Magnetic Tunnel Junction (MTJ) structure inserted in the variable resistance structure and comprising a first magnetic layer having a pinned magnetization direction, a second magnetic layer having a variable magnetization direction, and a tunnel dielectric layer interposed between the first magnetic layer and the second magnetic layer.

2. The electronic device of claim 1, wherein the MTJ structure has two different resistance states that correspond to a parallel magnetization direction configuration and an anti-parallel magnetization direction configuration of the first magnetic layer and the second magnetic layer, respectively.

3. The electronic device of claim 1, wherein the magnetization direction of the second magnetic layer is changed by spin transfer torque.

4. The electronic device of claim 1, wherein the semiconductor memory has a plurality of resistance states by a combination of a resistance state of the variable resistance layer and a resistance state of the MTJ structure.

5. The electronic device of claim 1, wherein the semiconductor memory exhibits one of resistance states including:
    a first resistance state in which the variable resistance layer has a high resistance state and the MTJ structure has a magnetization parallel state,
    a second resistance state in which the variable resistance layer has a low resistance state and the MTJ structure has the magnetization parallel state,
    a third resistance state in which the variable resistance layer has the low resistance state and the MTJ structure has a magnetization anti-parallel state, and
    a fourth resistance state in which the variable resistance layer has the high resistance state and the MTJ structure has the magnetization anti-parallel state.

6. The electronic device of claim 5, wherein the semiconductor memory has respective resistance values in the first to fourth resistance states such that the resistance value decreases in an order of the fourth resistance state, the first resistance state, the third resistance state and the second resistance state.

7. The electronic device of claim 5, wherein the resistance state of the semiconductor memory changes in a predetermined order based on the first, second, third and fourth resistance states.

8. The electronic device of claim 7, wherein a voltage with positive polarity is applied to the semiconductor memory for changing the resistance state from the first resistance state to the second resistance state and from the fourth resistance state to the first resistance state and a voltage with negative polarity is applied to the semiconductor memory for changing the resistance state from the second resistance state to the third resistance state and from the third resistance state to the fourth resistance state.

9. The electronic device of claim 7, wherein a greater voltage is applied to the semiconductor memory for changing the resistance state from the first resistance state to the second resistance state and from the third resistance state to the fourth resistance state than those for changing the resistance state from the second resistance state to the third resistance state and from the fourth resistance state to the first resistance state.

10. The electronic device of claim 5, wherein when an operation in which the variable resistance layer is changed from the high resistance state to the low resistance state is referred to as a first set operation, an operation in which the variable resistance layer is changed from the low resistance state to high resistance state is referred to as a first reset operation, an operation in which the MTJ structure is changed from the magnetization anti-parallel state to the magnetization parallel state is referred to as a second set operation, and an operation in which the MTJ structure is changed from the magnetization parallel state to the magnetization anti-parallel state is referred to as a second reset operation,
- a voltage polarity where the first and second set operations are performed is different from a voltage polarity where the first and second reset operations are performed.

11. The electronic device of claim 5, wherein when an operation in which the variable resistance layer is changed from the high resistance state to the low resistance state is referred to as a first set operation, an operation in which the variable resistance layer is changed from the low resistance state to the high resistance state is referred to as a first reset operation, an operation in which the MTJ structure is changed from the magnetization anti-parallel state to the magnetization parallel state is referred to as a second set operation, and an operation in which the MTJ structure is changed from the magnetization parallel state to the magnetization anti-parallel state is referred to as a second reset operation,
- a magnitude of a voltage where the first set operation and the first reset operation are performed is larger than a magnitude of a voltage where the second set operation and the second reset operation are performed.

12. The electronic device of claim 1, wherein the variable resistance layer includes a first variable resistance layer and a second variable resistance layer that are formed on both surfaces of the MTJ structure, respectively.

13. The electronic device of claim 5, wherein the variable resistance layer includes a first variable resistance layer and a second variable resistance layer that are formed on both surfaces of the MTJ structure, respectively,
- the conductive filaments of the first and second variable resistance layers are maintained in the second and third resistance states, and
- only one of the conductive filaments of the first and second variable resistance layers is maintained in the first and fourth resistance states.

14. The electronic device of claim 1, wherein the variable resistance layer comprises metal oxide.

15. The electronic device of claim 14, wherein the conductive filaments include oxygen vacancies that cause the formation or the dissipation of the conductive filaments.

16. The electronic device of claim 1, wherein the first and second magnetic layers have a conductivity.

17. The electronic device of claim 1, wherein the variable resistance structure includes a first variable resistance layer and a second variable resistance layer that are respectively on opposite sides of the MTJ structure, and
- wherein the semiconductor memory comprises further includes:
- a first electrode coupling to the first variable resistance layer; and
- a second electrode coupling to the second variable resistance layer.

18. The electronic device of claim 5, wherein the variable resistance layer includes a first variable resistance layer and a second variable resistance layer that are formed on both surfaces of the MTJ structure, respectively, and
- in an initial state, the semiconductor memory has the first resistance state and the conductive filaments of the first and second resistance layers do not exist.

19. The electronic device according to claim 1, further comprising a processor which includes:
- a core unit configured to perform, based on a command inputted from an outside of the processor, an operation corresponding to the command, by using data;
- a cache memory unit configured to store data for performing the operation, data corresponding to a result of performing the operation, or an address of data for which the operation is performed; and
- a bus interface connected between the core unit and the cache memory unit, and configured to transmit data between the core unit and the cache memory unit,
- wherein the semiconductor memory is part of the cache memory unit in the processor.

20. The electronic device according to claim 1, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside,
- wherein the semiconductor memory is part of the storage device or the temporary storage device in the data storage system.

* * * * *